United States Patent [19]

McGeorge

[11] 4,200,900
[45] Apr. 29, 1980

[54] CIRCUIT BOARD ARRANGEMENT

[75] Inventor: Gram McGeorge, Holland, Mich.

[73] Assignee: Robertshaw Controls Company, Richmond, Va.

[21] Appl. No.: 920,960

[22] Filed: Jun. 30, 1978

[51] Int. Cl.$^2$ .............................................. H02B 1/02
[52] U.S. Cl. ............................. 361/412; 174/138 D; 361/403; 361/413; 361/418
[58] Field of Search ............... 361/412, 413, 403, 418; 174/138 D

[56] References Cited

U.S. PATENT DOCUMENTS

| | | | |
|---|---|---|---|
| 3,668,476 | 6/1972 | Wrabeu et al. | 361/413 |
| 3,688,635 | 9/1972 | Fegen | 174/138 D |
| 3,777,052 | 12/1973 | Fegen | 174/138 D |

*Primary Examiner*—David Smith, Jr.
*Attorney, Agent, or Firm*—Fulwider, Patton, Rieber, Lee & Utecht

[57] ABSTRACT

A space-saving arrangement is provided to easily accommodate several modified electronic circuit board modules. Primary and auxiliary electronic circuit boards, each carrying separate electronic components are releasably fastened in parallel arrangement by spacing elements. A releasable unitary electrical interface connector is also disposed between the primary and auxiliary circuit boards, so that the two boards can be electrically connected, when mounted together, and disconnected when separated.

7 Claims, 5 Drawing Figures

U.S. Patent
Apr. 29, 1980
4,200,900
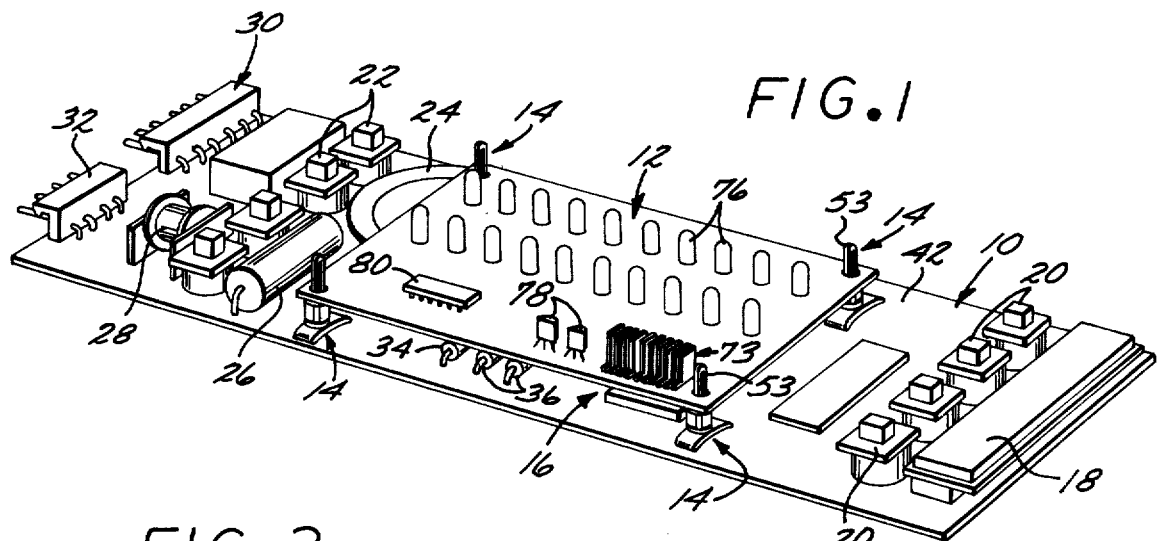
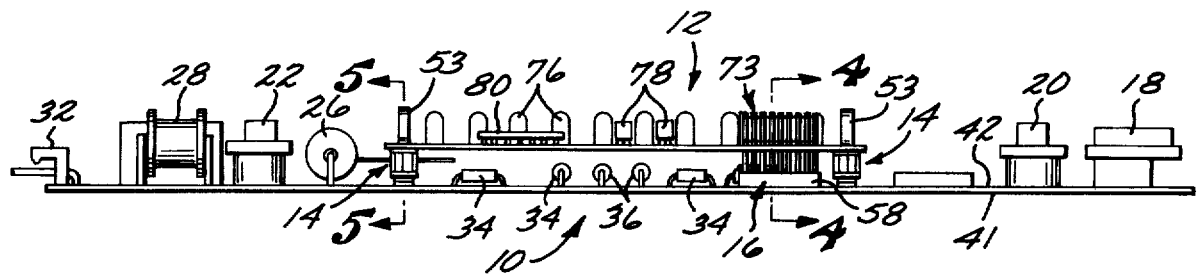
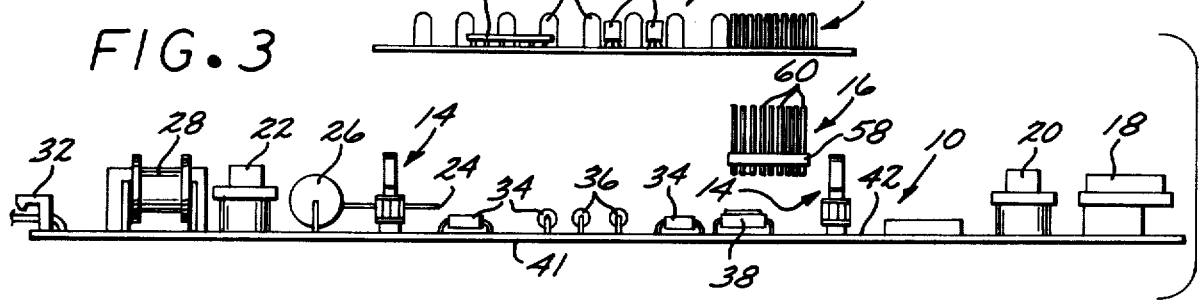
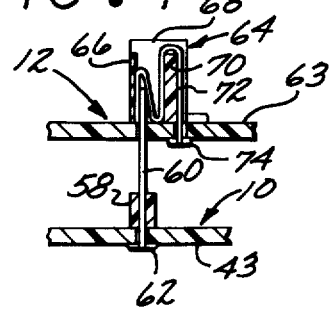
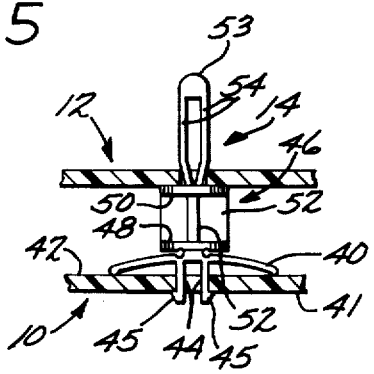

CIRCUIT BOARD ARRANGEMENT

BACKGROUND OF THE INVENTION

1. Field of the Invention

The present invention relates to mounting arrangements for electronic circuit boards, especially those employing miniaturized electronic components.

2. Description of the Prior Art

With the advent of compact, miniaturized electronic components, it was found that a number of electronic circuit components could be conveniently mounted on a single rigid planar circuit board structure mounting was on one side of the structure, with electrical contacts interconnected by paths of solder printed on the reverse side of the circuit board. Such printed circuit boards are constructed by first perforating the planar boards with small apertures spaced at predetermined locations to accommodate the pin connections of the electronic circuit elements. These elements typically include electronic large scale integrated (LSI) components, resistors, capacitors, diodes and visual display indicators. Such indicators typically include light emitting diodes (LED's), liquid crystal diodes (LCD's) and ionized gas discharge displays. In addition, such items as transistors, and pressure sensitive manual operated electronic switches are frequently mounted on printed circuit boards. Once these electronic components are in place on one side of the board with electrical pin contacts extending into apertures in the board, the pin connections protruding through on the reverse printed side of the board are soldered. This establishes electrical paths to interconnect the various electronic components in a predetermined fashion. Thereafter, the excessive lengths of the pin connection leads are cut. The printed side of the board may thereafter be coated with a protective lamination to inhibit degradation of the solder-imprinted circuit material, if desired. The board is then ready for use.

While many of the foregoing operations were initially performed manually, the construction of printed circuit boards has become increasingly mechanized. Presently, digitally controlled machines extract the electronic components from a traveling tape, bend the electronic pin connections as required, and place each circuit component in its appropriate position on the circuit board, with the pin connections extending through the apertures designed to accommodate them. The pin connections are typically no longer manually soldered, but instead are frequently wave-soldered. This involves passing the printed circuit board across a drum rotating in a reservoir of liquified solder so that the solder contacts the pin connections and establishes all of the soldered connection. The printed circuit board is then passed to a cutting station, where a high speed hardened rotary saw blade cuts the excess length of the pin connections just above the surface of the printed side of the circuit board. Thereafter, the printed circuit board may then be dispatched to a coating station, where a layer of liquid resin, or other protective material, is applied to the printed side of the circuit board to prevent oxidation or other degradation of the printed connections.

In the current state of manufacture of electronic printed circuit boards, all of the foregoing operations are often performed automatically, with manual attention required only to detect imperfections in the mechanized manufacturing process. Because of the high degree of automation, and especially in placing of the electronic components on the printed circuit boards under digital control, it is highly advantageous to place the electrical components on the circuit board in a high volume, mass production, without deviations in the type of component, or in the position of component placement. Thus, a very large number of printed circuit boards can be manufactured, with the placing of electrical components performed pursuant to a single program for an electronic computer governing component placement. This minimizes computer programming costs, and reduces difficulties in coordinating operation of the computer pursuant to a particular computer program, in the provision of the correct tape of electronic components designed for use with that program.

SUMMARY OF THE INVENTION

It is an object of the present invention to provide a circuit board arrangement which will accommodate modifications of control functions and indicator displays, while still maintaining a common fundamental control and display approach, without requiring modification of the printed circuit board governing most of the control functions to be performed. This is possible, according to the present invention, by providing an auxiliary printed circuit board which may be interconnected, or not, as desired, to modify the fundamental operating features performed by the components of a primary printed circuit board.

It is typically the case, with regard to commercial devices utilizing printed circuit boards for an electronic control structure, for a manufacturer to offer several different models of a device, each having different operating features. This is true of a wide variety of commercial products, from microwave oven controls to hand and desk calculators. For example, in microwave ovens sold by a single manufacturer, the most economical model will include certain fundamental operating controls and displays. One typical control is termed a "recall" version of a microwave oven control. In the "recall" version, the desired power level and the probe setting for a thermistor probe placed in a comestible in the oven are run through a display in sequence. By use of buttons in the control panel, the probe setting and the power level are sequentially incrementally advanced by repeated depression of the buttons, and the current power level is displayed. On some of the more sophisticated versions of microwave oven controls, however, it is felt that visual indicators should be provided for each possible setting. Only the visual indicator associated with the programmed setting is illuminated at any given time, however.

Both of these types of microwave oven controls include the same fundamental operating features and employ the same electronic components to a large degree. However, to avoid requiring re-programming of the machine for placing the electronic components on the circuit board, in order to accommodate the several control models, the electronic components associated only with the more sophisticated version of the device are placed on a separate printed circuit board. In the past, this would present a considerable space problem, since only a very limited space is available for occupancy by printed circuit boards in most control panels. However, by attaching the auxiliary printed circuit board directly to the primary printed circuit board, according to the present invention, no increase in size in the board module rack or increase in number of board positions in the rack are required. Rather, those components associated only with the more sophisticated oven controls are placed on an auxiliary circuit board, while the primary circuit board remains the same for all models. The auxiliary circuit board is then mounted directly on the primary circuit board in parallel or "piggyback" arrangement.

The overall thickness of the pair of parallel boards is not greatly increased beyond that required for a single primary circuit board utilized with the more economical versions of the control because the circuit components on the primary circuit board can be arranged so that the components which protrude furthest from the plane of the primary circuit board are grouped together. These components normally include the larger circuit elements, such as capacitors, displays, push button controls, and transformers. Conversely, the circuit components which have a lower profile relative to the surface of the circuit board are likewise grouped together. These components typically include diodes, resistors, and integrated circuit chips. The auxiliary printed circuit board is then located immediately above the circuit elements of lower profile and at a distance from the primary circuit board just sufficient to clear the low profile elements on the primary circuit board. Thus, the extent to which the circuit elements on the auxiliary printed circuit board protrude above the plane of the primary printed circuit board is generally substantially the same as the degree to which the more massive electrical components, mounted beyond the area encompassed by the auxiliary circuit board, stand above the primary board.

A further object of the invention is to provide a means by which the electrical connections necessary to modify different models of a control can be easily established or omitted, without redesign of the primary circuit board layout. Also, the electrical interface connector provided pursuant to the present invention requires no additional soldering procedures not already entailed in the manufacture of the primary printed circuit board. This is achieved by providing a unitary interface connector, which can be inserted into the primary circuit board for the particular boards that are to be used with the more sophisticated control. Placement follows automatic placement of all of the other electronic components on the primary circuit board, and is performed manually in a single procedure, regardless of the number of electrical interface contacts employed. The unitary interface connector is then wave soldered with the rest of the electrical components onto the primary electronic circuit board.

No solder connections are required to establish electrical circuit paths from the primary circuit board to the auxiliary circuit board. Rather, the separate conductors of the unitary interface connector are captured by spring-loaded electrically conductive contacts on the auxiliary circuit board as the primary and auxiliary boards are fastened together.

The invention may be explained with greater clarity and particularity with reference to the accompanying drawings.

DESCRIPTION OF THE DRAWINGS

FIG. 1 is a perspective view of an assembled circuit board arrangement according to the invention;

FIG. 2 is a side elevational view of FIG. 1;

FIG. 3 is an exploded view of the structure of FIGS. 1 and 2;

FIG. 4 is a sectional detail taken along the lines 4—4 of FIG. 2;

FIG. 5 is a sectional detail taken along the lines 5—5 of FIG. 2.

DESCRIPTION OF THE EMBODIMENT

FIG. 1 illustrates a rigid planar rectangular primary electronic circuit board 10 and a shorter and narrower rectangular printed circuit board 12 mounted parallel to the circuit board 10 and held at a spaced distance therefrom by mounting pins 14 at each corner of the auxiliary circuit board 12. A unitary interface connector 16, visible in isolation in FIG. 3, is provided to establish the necessary interconnection of circuits of the primary circuit board 10 and the auxiliary circuit board 12.

The primary circuit board 10 has a number of different electronic components mounted on the upper surface thereof, as illustrated in FIGS. 1, 2 and 3. These components include a gas discharge display 18, push button switches 20 and 22, an audible speaker or horn 24, a large capacitor 26, a transformer 28, and modular interconnecting pin arrays 30 and 32 which provide electrical paths to a power supply and other external circuitry. When the electronic circuit board structure of the embodiment is utilized as a microwave oven control, the paths from the interconnecting pin structures 30 and 32 are established to the oven magnatron, the a.c. power supply, and the comestible probe.

It should be noted that the circuit components heretofore discussed are all relatively massive and extend a relatively great distance above the flat surface 42 of the planar primary circuit board 10 upon which they are mounted. Even so, the tallest of these components, the push buttons 20 and 22, extend no further than about ⅜" above the surface of the primary circuit board 10. The relative heights of the circuit elements are clearly visible in FIGS. 2 and 3.

It should also be noted that the larger circuit components heretofore described are arranged in groups at either end of the primary circuit board 10. In the midsection of the primary circuit board 10, a number of other electronic components are likewise firmly attached in permanently mounted arrangement. These circuit elements are of the type which have a low profile relative to the component mounting surface of the primary board 10, and include resistors 34, diodes 36, and IC chips 38, as most clearly depicted in FIG. 3. Because these smaller circuit components require considerably less overhead clearance, as contrasted with the more massive components at either end of the primary circuit board 10, and because these smaller components are grouped together near the midsection of the primary board 10, the space between the primary circuit board 10 and the auxiliary circuit board 12 is minimized.

The mounting pins 14 are located at each of four widely separated apertures defined through the structure of the primary circuit board 10. The mounting pins 14 are typically plastic spacing pins that project outward from the primary circuit board 10. The mounting pins 14 are depicted in detail in FIG. 5, and include an arcuately shaped mounting base 40, laterally disposed relative to the electronic component mounting surface 42 of the circuit board 10, and contacting the mounting surface 42 at either extremity, as depicted. From near the center of the underside of the arcuate mounting base, a pair of opposing arms 44 extend through an aperture defined in the primary circuit board 10. The arms 44 each include an outwardly directed lip, which defines a slight horizontal shoulder, sufficient to grasp the structure of the primary circuit board 10 at the undersurface 41 thereof. The outer surfaces 45 of the tips of the arms 44 are slanted, so as to facilitate insertion of the arms 44 into an aperture in the circuit board 10.

Above the arcuate base 40, a spacer section 46 of each mounting pin 14 is defined. The spacer 46 includes a pair of laterally disposed disc-shaped sections 48 and 50, mounted in vertical displacement one above the other, and fastened by radially directed support partitions 52. The upper surface of the disc 50 provides a seat for the auxiliary circuit board 12. Rising from the center of the disc 50 and directed outwardly from the primary circuit board 10, is a center post 53 formed with a pair of legs 54 connected together at the disc 50. The legs 54 are separated by an elongated gap in the center post 53.

The unitary interface connector 16 for establishing electrical paths between corresponding terminals of the primary and auxiliary circuit board is visible in isolation in the exploded view of FIG. 3. The connector 16 includes a transverse plastic support bar 58 which holds a plurality of straight conductor wires 60 parallel to each other and in a linearly oriented array. The attachment of a single one of the conductor wires 60 is illustrated in FIG. 4. The printed circuits on the underside 41 of the primary circuit board 10 include a number of pin terminations, one of which is at the solder connection 62 where the conductor wire 60 appears. To install the unitary connector 16, the conductor wires 60 are each directed into predetermined apertures in the circuit board 10, following placement of the other electrical components on the primary circuit board 10. The conductor wires 60 are then wave soldered, along with the other electrical pin terminations in the otherwise conventional manufacture of the primary printed circuit board 10. The conductor wires 60 are thereby permanently connected to the primary printed circuit board 10.

On the top side 63 of the auxiliary circuit board 12, a socket housing 64 is mounted in permanent attachment. The socket housing 64 is a plastic structure having a single vertical back panel 66 formed with parallel divider panels 68 that extend to intersect a support panel 70 which is elongated and parallel to the back panel 66. The support panel 70 supports electrically conductive spring biased contact wires 72 in the spaces defined between each of the dividers 68. One end of each of the spring contact wires 72 passes through an aperture in the auxiliary circuit board 12, where it appears at termination defined by solder terminals 74 at the underside of the auxiliary circuit board, such as that depicted in FIG. 4. The solder terminations 74 are formed in the wave soldering step in the manufacture of the auxiliary circuit board 12 in the manner previously described. The spring biased contact wires 72 extend vertically upward from the terminals 74 and are bent over the support partition 70 and extend downward to the upper mounting surface 63 of the auxiliary circuit board 12, where they are again bent upward, and thereafter bent downward again in contact with the interior surface of the back panel 66. When the auxiliary circuit board 12 is mounted upon the primary circuit board 10, the upper extremities of the electrical contact wires 60 of the unitary interface connector 16 are brought into registration with the sockets defined by the loops of the spring biased conductive contact wires 72, and deflect the wires 72 to ensure electrical contact therewith. Thus, the terminals 74 of the auxiliary circuit board 12 are connected in electrical communication with respective corresponding terminals 62 on the underside 41 of the primary circuit board 10.

The auxiliary circuit board 12 is a printed circuit board manufactured using conventional techniques, with the exception of the socket support structure illustrated in FIG. 4. A number of light emitting diodes 76, transistors 78, and an IC circuit chip 80 are mounted on the upper surface 63 of the auxiliary circuit board 12. On the opposite side of the auxiliary circuit board 12, printed circuit paths appear and are soldered to pin connections of the electrical components in a conventional manner, as previously described. The socket housing 64 is held to the upper surface of the auxiliary circuit board 12 by the soldered connections of the terminals 74, but is also preferably glued to the upper surface 63.

To assemble the circuit board structure of FIGS. 1 and 2, the mounting pins 14 are first inserted into the apertures provided for that purpose in the primary circuit board 10. With reference to FIG. 5, the tips of the arms 44 are first directed and forced into the aperture. The slant of the outside surfaces 45 of the tips of the arms 44 causes the arms to be compressed and deflected toward each other as they pass into the aperture. Once through the circuit board 10, the arms 44 spring outward so that the shoulders defined by the lips thereon grasp the edges of the underside 41 of the printed circuit board 10. The tips of the arms 44 are pulled snuggly against the underside 41 of the circuit board 10 by the resiliency of the arcuate base 40.

Once the mounting pins 14 are in position, the auxiliary circuit board 12 can be mounted on the primary circuit board 10. The auxiliary circuit board 12 is positioned over the central portion of the primary circuit board 10 above the circuit element components having a low profile, as previously described, and with apertures at each of the four corners of the auxiliary circuit board 12 directly above the center posts 53 of the mounting pins 14. The auxiliary circuit board 12 is then forced downward upon the upwardly projecting mounting pins 14. The legs 54 of the center posts 53 of the mounting pins 14 are sufficiently long to be resiliently yieldable, and the apertures in the auxiliary circuit board 12 are sized just large enough to allow the center posts 53 to pass through as the auxiliary circuit board 12 is forced toward the primary circuit board 10. The limit of movement of the auxiliary circuit board 12 toward the primary circuit board 10 is defined by the upper surface of the spacer discs 50, which holds the auxiliary circuit board 12 above the primary circuit board 10 at a distance just sufficient to provide clearance for the electrical components 34–38 on the primary circuit board 10 located therebetween. In this position, the auxiliary circuit board 12 is held at the neck of the center posts 53 of the mounting pins 14, since the legs 54 are resilient enough to spring outward once the auxiliary board 12 is seated on the upper surfaces of the discs 50. The auxiliary circuit board 12 is thereby held in releasably locked engagement at a spaced distance from the primary circuit board 10 upon the mounting pins 14.

As the auxiliary circuit board 12 is mounted upon the primary circuit board 10, with the mounting pins 14 performing the physical attachment depicted in FIG. 5, the conductive contact wires 60 are brought into registration with spring biased electrical contact wires 72 in the socket arrangement illustrated in FIG. 4. Thus, the appropriate electrically conductive paths are established to allow electrical interaction between the circuit elements on the auxiliary circuit board 12 and the circuit elements on the primary circuit board 10.

It can be seen that the primary circuit board 10 can be used either alone, or in combination with the auxiliary circuit board 12. The basic control and display functions performed are the same in either event. However, when employed in combination with the auxiliary circuit board 12, additional display and control features are provided and electrical interconnection is established between the electrical terminals 74 on the auxiliary circuit board 12 and the electrical terminals 62 on the primary circuit board 10.

It can be seen with reference to FIG. 2 that the overall thickness of the composite structure is not greatly increased even when the primary circuit board 10 is combined with the auxiliary circuit board 12. This is because the electrical components mounted on either end of the primary circuit board 10 extend nearly as far above the circuit board 10 as do the light emitting diodes 76 and the other electrical components and socket housing 73 on the auxiliary circuit board 12. By arranging circuit board elements in this fashion, no significant increase in spatial requirements is required to accommodate the combined structure of the primary circuit board 10 and the auxiliary circuit board 12, as contrasted with the space requirement for the primary circuit board 10 alone.

While numerous variations and modifications of the present invention will undoubtedly become readily apparent to those skilled in the art, the inveniton should not be considered restricted to the specific embodiment illustrated. Rather, the scope of the invention is defined in the claims appended hereto.

I claim:

1. A printed circuit board arrangement comprising:
   a planar primary circuit board having widely spaced apertures defined therein and containing electrical circuit components and auxiliary circuit board electrical interface terminations located in physical proximity to each other permanently mounted thereon;
   mounting pins arranged in said widely spaced apertures to project outward from said primary circuit board;
   a planar auxiliary circuit board having electrical components and primary circuit board electrical interface terminations arranged in physical proximity in a pattern corresponding to the arrangement of said auxiliary circuit board electrical interface terminations on said primary board, wherein said auxiliary circuit board is disposed in parallel arrangement relative to said primary circuit board, and has apertures therein to receive said mounting pins, which carry said auxiliary board in releasable locked engagement with said primary board by said mounting pins at a spaced distance from said primary circuit board to provide clearance for electrical components on said primary circuit board; and
   a unitary interface connector having separate conductors to connect each of said corresponding ones of said auxiliary circuit board electrical interface terminations and said primary circuit board electrical interface terminations, and further characterized in that terminations of at least one of said circuit boards include sockets defined on the mounting surface thereof opposite the surface facing the other board, and said sockets include a support partition extending outward away from said mounting surface, a back panel spaced from said support partition, apertures in said mounted surface spaced to receive said separate conductors, spring biased electrically conductive contact wires extending outward away from said mounting surface, over said support partition, back toward said mounting surface, and outward again in a loop residing against said back panel, and said contact wires are deflected by, and establish electrical contact with said conductors and
   said primary circuit board terminations are linearly arranged at spaced intervals and said auxiliary circuit board terminations are linearly arranged at identical spaced intervals and said connector includes a transverse support bar carrying a plurality of straight parallel conductor wires, each for joining terminations in said primary and auxiliary circuit board in releasable electrical connections.

2. Apparatus according to claim 1 further characterized in that said connector is removable from said auxiliary circuit board.

3. Apparatus according to claim 2 further characterized in that each of said mounting pins includes a spacing pedestal for limiting the approach of said auxiliary circuit board relative to said primary board, and a laterally compressible center post extending beyond said spacing pedestal and said auxiliary circuit board to act against the confines of an aperture therein to hold said auxiliary circuit board as aforesaid.

4. Apparatus according to claim 3 further characterized in that said mounting pins are removably secured to said primary circuit board in snap lock arrangement.

5. A physical support for electrical circuitry comprising:
   a planar primary circuit board with electrical components securely attached thereto and with interface terminals disposed in a compact, ordered array,
   a planar auxiliary circuit board having electrical components securely attached thereto and with interface terminals disposed in a compact, ordered array corresponding to the ordered array of said terminals of said primary circuit board;
   a plurality of mounting spacers interposed between and releasably interconnecting said circuit boards and holding them in parallel uniformly spaced arrangement to provide clearance to circuit components located therebetween; and
   connection means for releasably connecting corresponding ones of said terminations on said primary and said auxiliary circuit boards,
   further characterized in that the terminations of at least one of said circuit boards include sockets defined on a mounting surface thereof opposite the surface facing the other board, and said sockets include a support partition extending outward away from said mounting surface, a back panel spaced from said support partition, apertures in said mounting surface spaced to receive said separate conductors, spring biased electrically conductive contact wires extending outward away from said mounting surface, over said support partition, back toward said mounting surface, and outward again in a loop residing against said back panel, and said contact wires are deflected by, and establish electrical contact with said conductors, and said primary circuit board terminations are linearly arranged at spaced intervals and said auxiliary circuit board terminations are linearly arranged at identical spaced intervals and said connector includes a transverse support bar carrying a plurality of straight parallel conductor wires, each for joining corresponding terminations in said primary and auxiliary circuit board in releasable electrical connections.

6. A support according to claim 5 further characterized in that said circuit boards are of rectangular shape, and said auxiliary circuit board is smaller than said primary circuit board, and mounting spacers are located at each corner of said auxiliary circuit board.

7. A support according to claim 5 further characterized in that said auxiliary circuit board covers only a portion of the area of said primary circuit board, and electrical components are mounted on said primary circuit board both between said primary and auxiliary circuit boards and beyond the edges of said auxiliary circuit board, and the electrical components mounted on said primary circuit board between said primary and auxiliary circuit boards extend above the surface of said primary circuit board a shorter distance than do at least some of the electrical components mounted on said primary circuit board beyond the extremities of said auxiliary circuit board.

* * * * *